US007551657B2

(12) United States Patent  
Nurmikko

(10) Patent No.: US 7,551,657 B2  
(45) Date of Patent: Jun. 23, 2009

(54) MAGNETO-OPTOELECTRONIC SWITCH AND SENSOR

(75) Inventor: Arto V Nurmikko, Providence, RI (US)

(73) Assignee: Brown University, Providence, RI (US)

( * ) Notice: Subject to any disclaimer, the term of this patent is extended or adjusted under 35 U.S.C. 154(b) by 0 days.

(21) Appl. No.: 12/288,173

(22) Filed: Oct. 16, 2008

(65) Prior Publication Data

US 2009/0052484 A1   Feb. 26, 2009

Related U.S. Application Data

(62) Division of application No. 10/488,570, filed as application No. PCT/US02/28216 on Sep. 5, 2002, now Pat. No. 7,440,479.

(60) Provisional application No. 60/317,583, filed on Sep. 6, 2001.

(51) Int. Cl.  
*H01S 3/30* (2006.01)  
*H01S 3/00* (2006.01)

(52) U.S. Cl. ............................. 372/37; 372/7

(58) Field of Classification Search ............... 372/7, 372/37, 50.1; 338/32 R  
See application file for complete search history.

(56) References Cited

U.S. PATENT DOCUMENTS

| 4,452,533 | A | 6/1984 | Miles et al. .................. 356/352 |
| 5,140,156 | A | 8/1992 | Imaeda et al. ............ 250/227.21 |
| 5,451,863 | A | 9/1995 | Freeman ....................... 324/96 |
| 5,517,170 | A | 5/1996 | Peters et al. ............... 338/32 H |
| 5,568,499 | A | 10/1996 | Lear .......................... 372/45.01 |
| 5,933,001 | A | 8/1999 | Hubbell ....................... 324/96 |
| 6,052,263 | A | 4/2000 | Gill ........................ 360/324.11 |
| 6,222,206 | B1 | 4/2001 | Chirovsky et al. ............. 257/98 |

FOREIGN PATENT DOCUMENTS

JP            11-052005         2/1999

OTHER PUBLICATIONS

He et al., "Hybrid magnetic tunneljunction/vertical cavity surface emitting laser field sensor device", Nov. 22, 2001, Electronics Letters, vol. 37, No. 24, pp. 1459-1460.

*Primary Examiner*—Armando Rodriguez  
(74) *Attorney, Agent, or Firm*—Harrington & Smith, PC

(57) ABSTRACT

A Magneto-Optoelectronic Device MOD (10) includes a magnetic sensing device (12), such as a magnetoresistive device or a magnetic tunnel junction device, that is combined with a semiconductor light emitter (14), such as a LED or a laser diode, to create a compact integrated device where changes in an ambient magnetic field are expressed as changes in an optical beam intensity emanating from the MOD. Using the MOD (10) the magnetic field related information can be transmitted by a light wave over very large distances through some medium (34), for example, through free space and/or through an optical fiber.

32 Claims, 9 Drawing Sheets

MAGNETO-OPTOELECTRONIC SWITCH AND SENSOR

CROSS-REFERENCE TO A RELATED PATENT APPLICATION

This application is a divisional of U.S. patent application Ser. No. 10/488,570, filed Sep. 15, 2004 now U.S. Pat. No. 7,440,479, which claims priority to International Patent Application No. PCT/US02/28216, filed on Sep. 5, 2002, and to Provisional U.S. Patent Application No. 60/317,583, filed on Sep. 6, 2001, for which the above-identified International Application claims priority.

STATEMENT OF GOVERNMENT RIGHTS

This invention was made with Government support under Army Research Office Grant 530-1617-03. The Government has certain rights in this invention.

TECHNICAL FIELD

These teachings relate generally to magnetic field sensing devices, and more specifically relate to an integrated circuit embodiment of a magnetic field sensor, such as a Magnetic Tunnel Junction (MTJ) sensor device whose output signal is used to modulate the optical output of a light emitting device, such as a Light Emitting Diode (LED) or a laser diode, such as Vertical Cavity Surface Emitting Laser (VCSEL).

BACKGROUND

The ability to remotely sense magnetic fields without direct physical presence or contact with the field location is important in many applications. These applications include the measurement of magnetic field changes in a difficult or hostile environment (such as earthquake warning or battlefield sensing, which are usually performed by a magnetometer in close physical proximity), or the sensing of information in a magnetic storage medium (as usually performed by a flying head of a computer hard disk drive). Another important application involves contactless sensing of current pulses on a microelectronic chip, especially the submicron scale interconnect lines used to wire the various parts of a chip together, and which limit the speed of the operation of the chip. The present methods for sensing and/or measuring magnetic fields, whether on a macroscale or a microscale, make telemetry cumbersome, as the measured magnetic fields or changes therein are detected by a magnetic field sensitive 'resistor' that converts the magnetic field information to an electrical signal. This approach typically requires physical placement of wires to the magnetic sensor element or its immediate vicinity. "Wireless" sensing offers many advantages over the conventional wired approach, but is more difficult to implement by conventional techniques. For example, in this case the telemetry may require the incorporation of a microwave transmitter as part of the sensor package. This requirement adds cost, complexity and increased power constraints to the sensor package.

It is well known in the art that certain magneto-optic effects exist. More specifically, the Kerr effect and the Faraday effect correspond to a change in the intensity or polarization state of light either reflected from (Kerr) or transmitted through (Faraday) a magnetic material. Since the amount of change in the polarization state or intensity is proportional to the magnetisation in the material, it is possible to use these effects to examine magnetic properties of materials. However, the use of the Kerr or Faraday effects requires a light source that can be disposed to illuminate a material of interest, as well as a detector that can be disposed to receive the reflected or transmitted light. For a number of important applications these requirements can be difficult to satisfy in a cost effect and simple manner.

SUMMARY OF THE PREFERRED EMBODIMENTS

The foregoing and other problems are overcome, and other advantages are realized, in accordance with the presently preferred embodiments of these teachings.

Disclosed herein is a Magneto-Optoelectronic Device (MOD) in which a magnetic sensing device (such as a magnetoresistive device or a MTJ device) is combined with a semiconductor light emitter (such as a LED or a laser diode) to create a compact integrated device where changes in an ambient magnetic field (i.e., a magnetic field in the vicinity of the MOD) are expressed as changes in an optical beam intensity emanating from the MOD. Using the MOD the magnetic field related information can be transmitted by a light wave over very large distances through, for example, free space and/or through an optical fiber.

In one embodiment this invention provides a light source for generating light that has an intensity that varies as a function of a strength of an ambient magnetic field. The light source includes an electrical resistance that varies as a function of the strength of the ambient magnetic field, and the electrical resistance is electrically coupled in series with a light emitter. The light source forms a part of a magnetic field sensor.

In another embodiment the invention provides a method for sensing a magnetic field. The method includes (a) generating light that has an intensity that varies as a function of a strength of a magnetic field; (b) detecting the light and (c) correlating the intensity of the detected light with the strength of the magnetic field. The step of sensing can be used to detect the presence or absence of the magnetic field.

In at least one embodiment the magnetic field may be indicative of information, and the methods and apparatus can be used to detect, readout and/or transmit information.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 5A shows the measured electrical resistance of the MTJ component as a function of applied magnetic field, for the case of a 40×40 square micron junction; and FIG. 5B shows the output power of the VCSEL as a function of the applied magnetic field;

DETAILED DESCRIPTION OF THE PREFERRED EMBODIMENTS

Figure 1A:
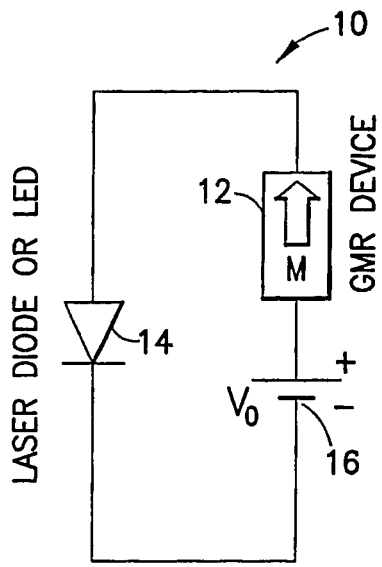
FIG. 1A is simplified schematic diagram of the hybrid Magneto-Optoelectronic Device (MOD) that is constructed to include a MTJ and a diode laser.

Referring to FIG. 1A, in accordance with the teachings of this invention an improved magnetic field sensor, also referred to herein as a hybrid Magneto-Optoelectronic Device (MOD) 10, is created by combining a thin film magneto-electronic device 12 with a compact semiconductor-based light source 14. The resulting improved magnetic field sensor 10 is preferably constructed as an integrated hybrid device where changes in the magnetic field sensed by the magnetic field sensing component 12 of the MOD 10 are translated into changes in the intensity of light emanating from the source 14. The changes in the optical intensity may be registered remotely from the MOD 10 by the use of conventional optical measurement techniques. In FIG. 1A the magneto-electronic device 12 is depicted as a magnetic field dependent resistor, and the light source 14, such as a LED or a diode laser, as a simple diode. Note that the circuit is a simple series circuit with the magneto-electronic device 12 and the light source 14 connected in series with a power supply, shown schematically as a battery 16. As is evident, a change in the resistance of the magneto-electronic device 12 due to a change in a sensed magnetic field translates into a change in the current flow through the light source 14, which in turn translates into a change in the intensity of the light output from the light source 14. In this manner a change in the strength of the magnetic field sensed by the magneto-electronic device 12 causes a modulation of the light output of the light source 14.

That is, the MOD 10 transduces a change in a magnetic field to a change in an optical output signal, which may then be propagated over large distances through free space and/or through an optical fiber.

The magneto-electronic component 12 of the MOD 10 may be based on a magnetoresistive sensor whose resistance is subject to change with changes in a magnetic field. The magnetoresistive sensor can comprise uniform thin films of suitable magnetic materials, as well as their heterostructure multilayers, where so-called "giant magnetoresistive (GMR) effects" have been found and exploited. Reference in this regard can be had, for example, to P. Grunberg, "Layered Magnetic Structures: History, Highlights, Applications", Physics Today 54, 31 (2001). In the presently preferred, but non-limiting, embodiment of this invention the magneto-electronic component 12 of the MOD 10 is embodied as a magnetic tunnel junction (MTJ). The MTJ is an example of a specific heterostructure in which a large change of resistance can be induced by changes in an external magnetic field. Reference with regard to the fabrication and operation of a MTJ can be had to the following exemplary publications: J. S. Moodera, L. R. Kinder, T. M. Wong, and R. Meservey, "Large Magnetoresistance at Room Temperature in Ferromagnetic Thin Film Tunnel Junctions", Phys. Rev. Lett. 74, 3273-3276 (1995); W. J. Gallagher, S. S. P. Parkin, Yu Lu, X. P. Bian, A. Marley, K. P. Roche, R. A. Altman, S. A. Rishton, C. Jahnes, T. M. Shaw, and G. Xiao, "Microstructured magnetic tunnel junctions", J. Appl. Phys. 81, 3741-3746 (1997); and E. Y. Chen, R. Whig, J. M. Slaughter, D. Cronk, J. Goggin, G. Steiner, and S. Tehrani, "Comparison of oxidation methods for magnetic tunnel junction material", J. Appl. Phys. 87, 6061-6063 (2000), incorporated by reference herein in their entireties.

Figure 7:
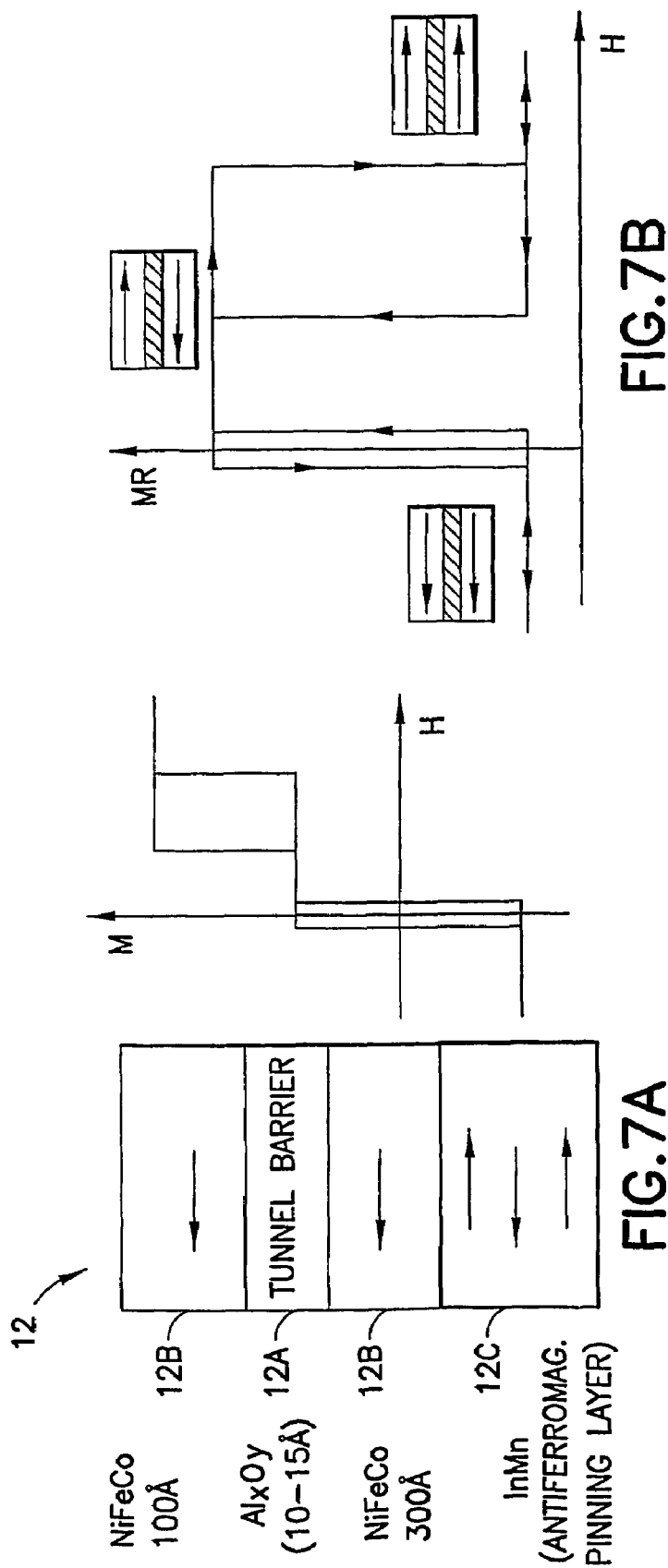
FIGS. 7A and 7B illustrate the construction and operational principles of the MTJ.

Referring to FIGS. 7A and 7B, the construction and operational principles of the MTJ 12 are shown. The MTJ 12 includes ferromagnetic (FM) layers 12B that surround a tunnel barrier layer 12A, and an anti-ferromagnetic (AF) layer 12C that functions a pinning layer. Typical layer thicknesses and compositions are also shown in the drawing. One constraint is keep the voltage across the MTJ less than about 0.4V.

While the MTJ is presently preferred for use as the magneto-electronic component 12 of the MOD 10, other types of components maybe employed. For example, any spin-valve type device may be employed as the magnetic field sensing component.

Fractional resistance changes of up to $\Delta R/R \sim 0.5$ have been obtained in Co—, CoFe or NiFe-based MTJs, as well as combinations of other magnetic alloys for magnetic fields on the order of 100 Oe. This effect has been exploited in magnetic hard drive sensors as a readout device. Development is also under way to create non-volatile random access memory chips (MRAM) by using the magnetic bistability that can be created in the resistive state of an MTJ, along the easy axis of magnetization. Reference in this regard can be had to, for example, S. Tehrani, J. Slaughter, E. Chen, M. Durlam, J. Shi, and M. DeHerrera, "Progress and Outlook for MRAM Technology", IEEE Transactions on Magnetics 35, 2814 (1999).

Figure 1B:
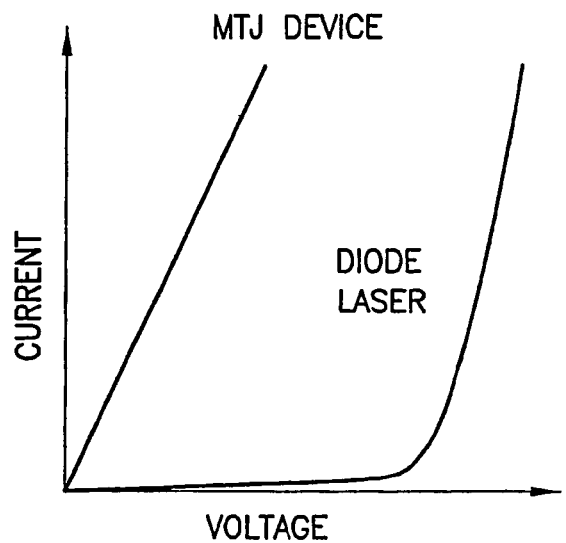
FIG. 1B is a graph illustrating the current/voltage characteristics of the MTJ and diode laser devices of FIG. 1A.

FIG. 1B shows the typical current voltage characteristics of each element of the circuit of FIG. 1A, connected to the common voltage supply 16 through a suitably chosen series ballast resistor (not shown). The voltage axis is representative of a typical MTJ and a GaAs-based diode laser. As is well known, a semiconductor diode laser is a threshold device where the onset of stimulated emission occurs at a set value of threshold current and voltage. The threshold voltage is approximately equal to the bandgap value for the semiconductor material, approximately 1.5 V for GaAs (~800 nm wavelength range) and ~1V for an InGaAs or InGaAsP laser in the 1.3-1.5 μm wavelength range.

Figure 2:
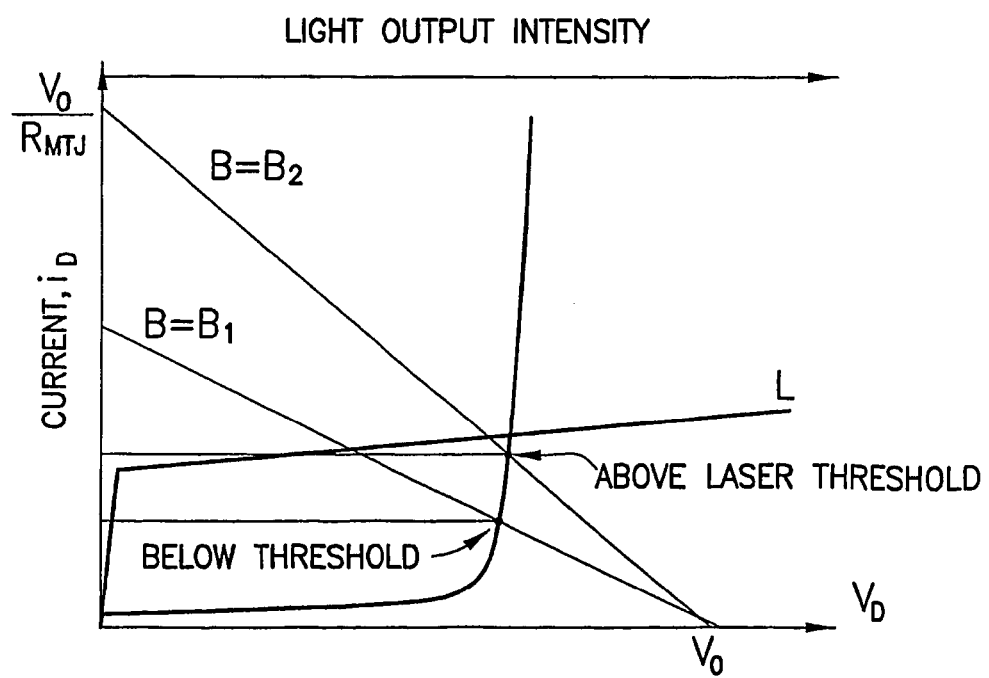
FIG. 2 is a graph illustrating the combined current/voltage characteristics of the MTJ and diode laser devices of FIG. 1A, as well as the light output of the diode laser device and a load line solution to an equivalent circuit.

An important aspect of the hybrid magnetic sensor 10 is that the electrical current and voltage range for the MTJ 12 and the semiconductor laser (or LED) 14 are compatible. In the case of the diode laser 14, developments in the vertical cavity surface emitting lasers (VCSEL) have led to threshold currents on the order of 0.1 mA. FIG. 2 shows the current-voltage and light output vs. voltage curves for the MTJ 12 and the diode laser 14, as well as the graphical solutions to the operation of the hybrid MOD 10.

In FIG. 2 it can be seen that the load line construction sets the operating point of the hybrid MOD 10 for two different values ($B_1$, $B_2$) of the magnetic field (B). In particular, for one value of the magnetic field ($B_1$), the resistance of the MTJ is such that the current flowing through the circuit is below the threshold of the laser 14. For a different value of the magnetic field ($B_2$) the resistance is reduced so that current in the circuit exceeds the threshold for the diode laser 14. As a result, for a value of the magnetic field that exceeds the threshold light is emitted from the hybrid MOD 10, which can be observed and measured at an arbitrary distance from the MOD 10 (see FIG. 6). The intensity of the light can be correlated with the strength of magnetic field, as is made evident in the graph of FIG. 2.

Figure 3:
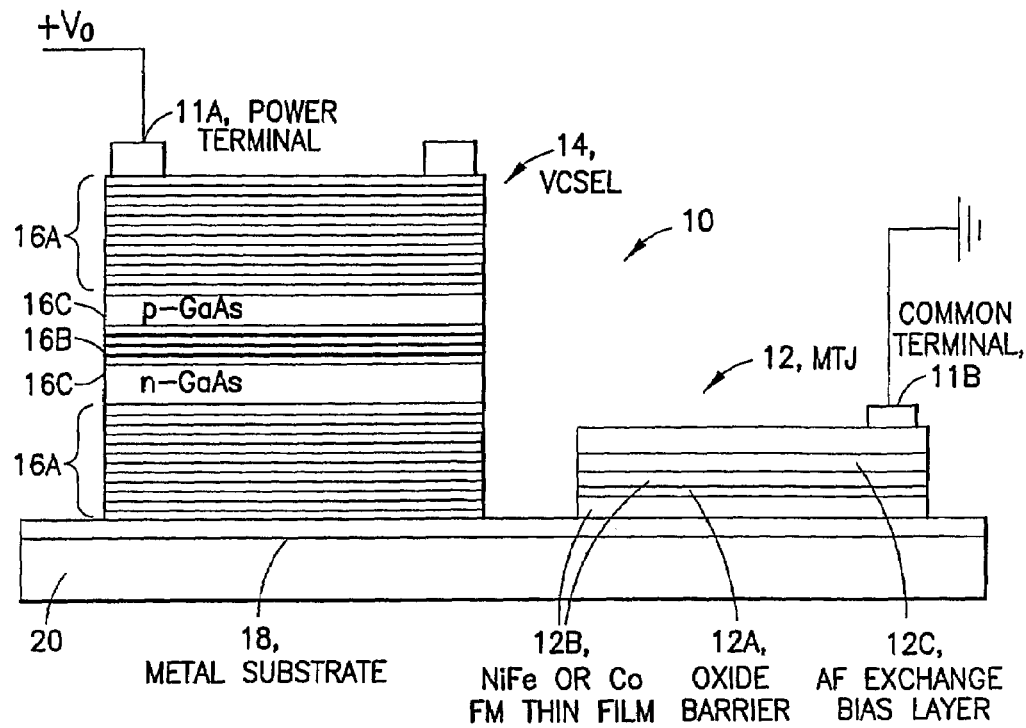
FIG. 3 is an enlarged cross-sectional view of a first embodiment of a combined VCSEL and MTJ MOD, fabricated so as to be integrated as two epitaxially layered stacks and interconnected via a common conductive substrate.

The two device components 12 and 14 are each quite compact, and can therefore be wired on a small scale integrated circuit chip with a footprint on the scale of few hundred square micrometers (or less). FIG. 3 shows a schematic illustration of the integration of the MTJ 12 and a VCSEL device as the light source 14. In this embodiment a series circuit path is formed from the +Vo power terminal 11A through the VCSEL 14, through an electrically conductive metal substrate or trace 18, and through the MTJ 12 to a circuit ground or circuit common terminal 11B. A supporting dielectric substrate 20, such as a layer of intrinsic silicon, alumina or a ceramic material, is typically also provided. The VCSEL 16 typically comprises multi-layer mirror or reflector structures (DBR layers) 16A that contain an a multi-quantum well (MQW) active region 16B surrounded by n-type and p-type GaAs confinement layers 16C. The MTJ 12 includes the oxide tunnel barrier layer 12A surrounded by NiFe or Co FM thin film layers 12B, and the adjacent AF exchange bias (pinning) layer 12C. The various layer thicknesses, compositions and fabrication techniques for the MTJ 12 and the VCSEL 14 maybe conventional in nature. The resulting enhanced compactness and robustness is particularly relevant in sensor applications, such as one encountered in the sensing head of a magnetic hard drive.

In this implementation the use of the VCSEL as the light source 14 is preferred for at two reasons: (1) the threshold currents available in a VCSEL can be at the sub-mA level, so that a value $I_{th}$~0.1-0.3 mA is readily achievable; and (2) the choice of a VCSEL geometry enables the further possibility of compact, monolithic integration of the MTJ 12 and the VCSEL 14 as part of the same multilayer material arrangement.

Figure 4:
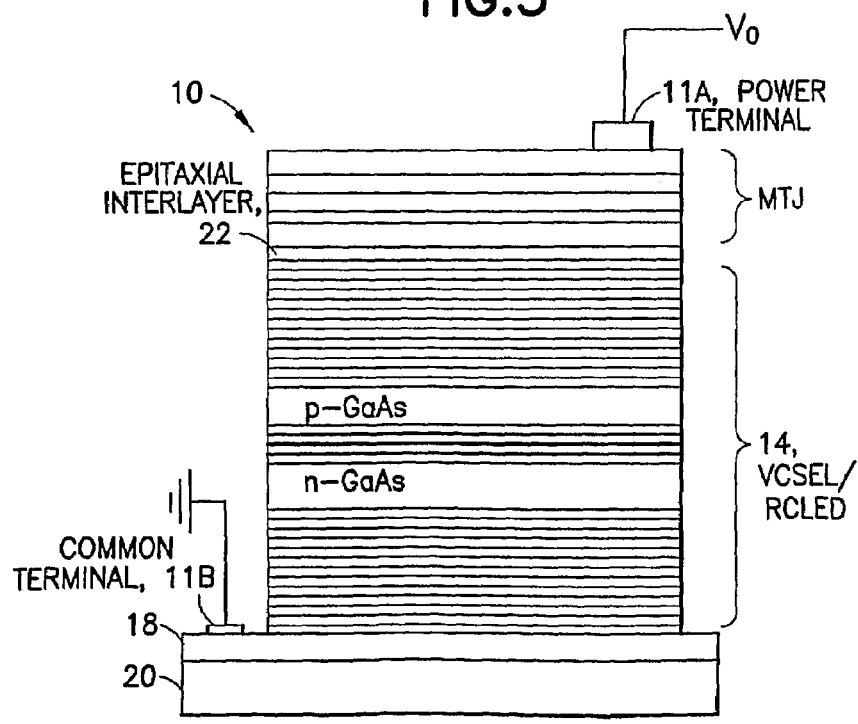
FIG. 4 is an enlarged cross-sectional view of a second embodiment of a combined VCSEL and MTJ MOD fabricated so as to be monolithically integrated as one epitaxially layered stack.

More particularly, in the embodiment of FIG. 3 the MTJ 12 and the VCSEL 14 are shown as separate, distinct devices. However, the layered geometry and planar device processing which are common to both the VCSEL 14 (and to a resonance cavity LED) and the MTJ 12 (and other thin film GMR devices) makes it possible to monolithically integrate both devices into a single multilayer stack. This embodiment is shown in FIG. 4, where typically the VCSEL 14 structure is grown first, with the top DBR mirror layer defining the substrate on which the MTJ 12 is subsequently deposited. An additional electrically conductive interlayer 22 maybe first deposited on the VCSEL 14 to optimize the substrate for the MTJ 12. In this manner a truly monolithic, ultracompact integrated magneto-optoelectronic device can be created, on a submicrometer scale if desired.

In the monolithically integrated embodiment shown in FIG. 4, where the MTJ 12 is stacked atop the VCSEL (or a resonance cavity LED (RCLED)) 14 and is separated therefrom by the (optional) electrically conductive epitaxial interlayer 22, the series circuit path is formed from the +Vo terminal 11A through the MTJ 12, through the interlayer 22, through the VCSEL (or RCLED) 14, through the electrically conductive metal substrate or trace 18, and through the MTJ 12 to the common terminal 11B. The supporting dielectric substrate 20 is typically also provided.

The resulting compactness of the embodiment of FIG. 4 may be exploited, for example, to fabricate a magnetic read head where the signal is transmitted wirelessly in the form of the laser beam from the VCSEL 14. Moreover, this embodiment may be extended to form a linear or a two-dimensional array of the MOD 10 with a very high packing density. Note as well that the light source 14 could be extended to include quantum dot VCSEL technology, in addition to quantum well VCSEL technology.

Figure 11:
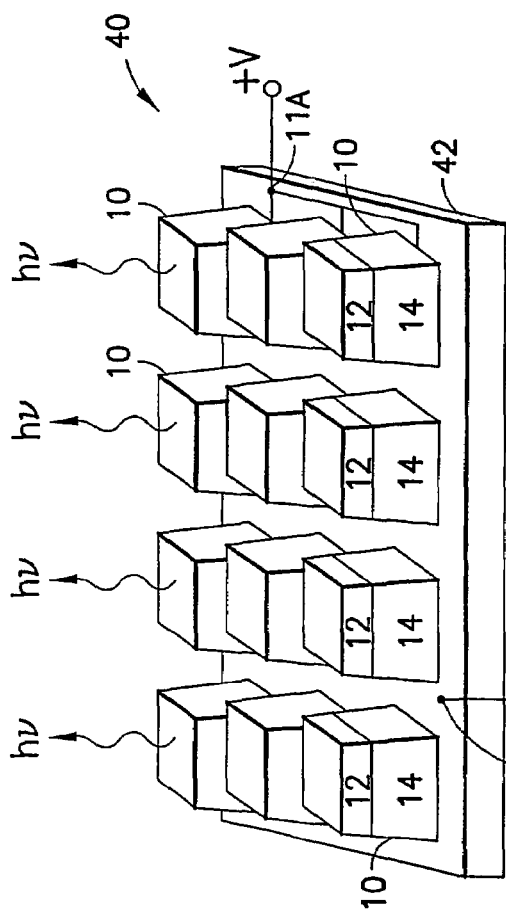
FIG. 11 is an enlarged elevational view of an exemplary 4×3 two dimensional array of the monolithic MODs of a type shown in FIG. 4.

As an example, FIG. 11 depicts an enlarged elevational view of an exemplary 4×3 two dimensional array 40 of the monolithic MODs. 10 of a type shown in FIG. 4. The MODs 10 are all supported by a common substrate 42, and each can be operated from the same supply voltage (Vo) as shown, or a separate, isolated voltage supply may be provided to each MOD 10.

This extension of the single hybrid MOD 10 to the two-dimensional array 40 of such devices can be accomplished by microelectronic fabrication techniques, along the lines outlined above for the embodiment of FIG. 4. By patterning the individual devices and isolating them electrically, a large number of the hybrid magneto-optoelectronic device 10 can be created and operated in parallel for enhanced magnetic field sensing and/or for reading out magnetically stored information (for example from a magnetic storage disk) at very high speeds and at high densities.

In the embodiment of FIG. 3 or FIG. 4 the threshold current/voltage of the VCSEL 14, as well as its dynamic resistance, are selected to be compatible with the current-voltage constraints imposed by the MTJ 12, as was shown with regard to FIG. 2. For example, with the resistance of a small area VCSEL 14 (A~100 µm) being on the order of 100Ω, it is preferred that the resistance of the MTJ 12 be several times smaller. This is true because the GMR effect in a MTJ device is strongly voltage dependent, decreasing roughly to half of its maximum at an applied voltage ~0.4 V across the MTJ 12. With the resistance ratios, for example, of $R_{VCSEL}/R_{MTJ}$~5:1, approximately 0.25 V is dropped across the MTJ 12 for a threshold voltage of the GaAs-based VCSEL of about 1.3 V.

Considerations of the maximum tolerable current density in turn may limit the operating range of the MTJ 12 to some fraction of one milliamp. These considerations imply that for state-of-the art MTJ devices, the effective area is preferably on the order of about $10^3$ µm$^2$.

Figure 8:
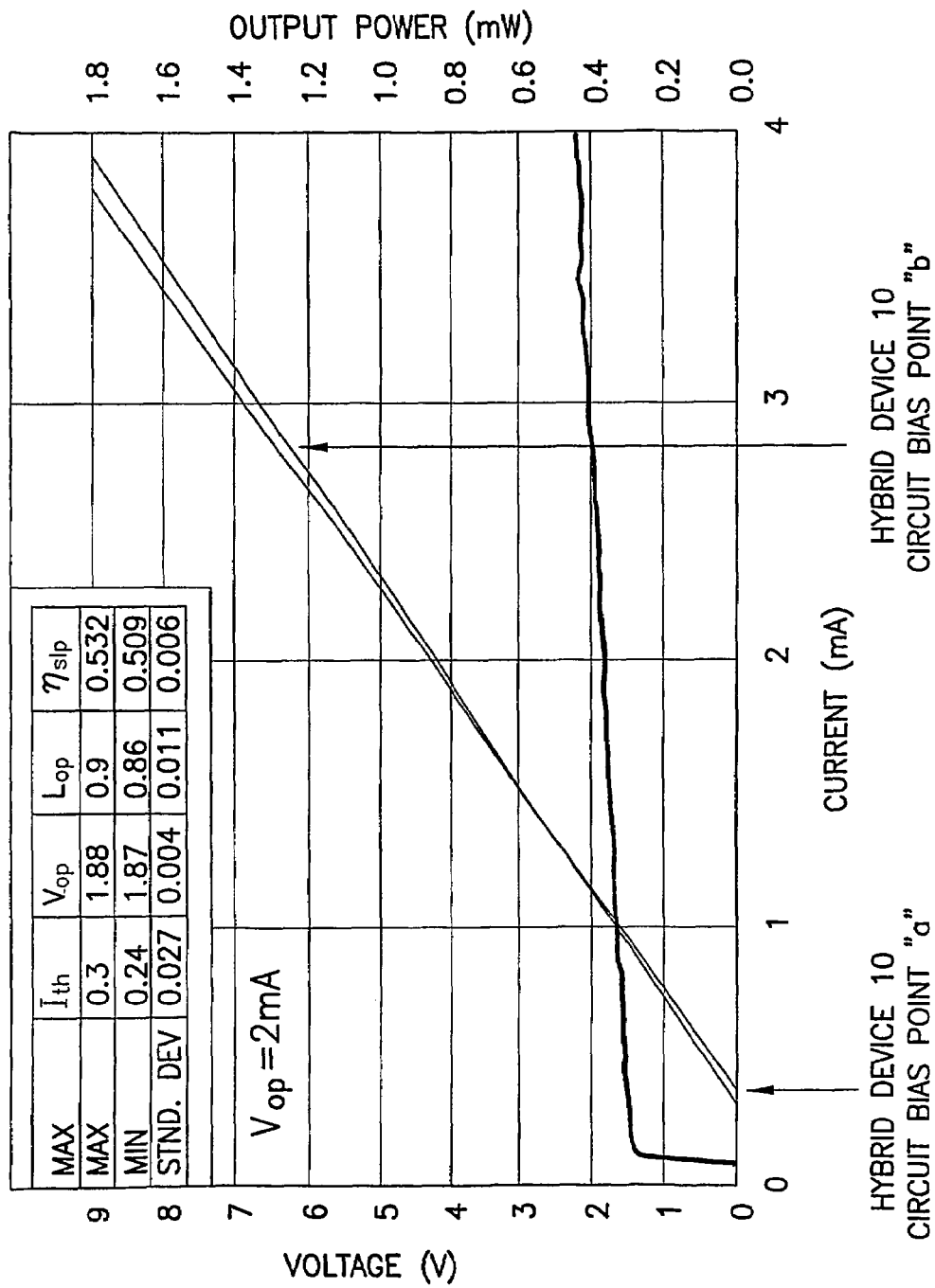
FIG. 8 is a graph illustrating VCSEL characteristics assuming a case of a 3 micron effective optical aperture, a $TEM_{00}$ GaAs quantum well (QW) active medium, and further shows two circuit bias points of the MOD.

FIG. 8 is a graph that illustrates characteristics of the exemplary VCSEL 14, assuming a case of a 3 micron effective optical aperture and a $TEM_{00}$ GaAs quantum well (QW) active medium. Also shown are two circuit bias points of the MOD 10.

Figure 9C:
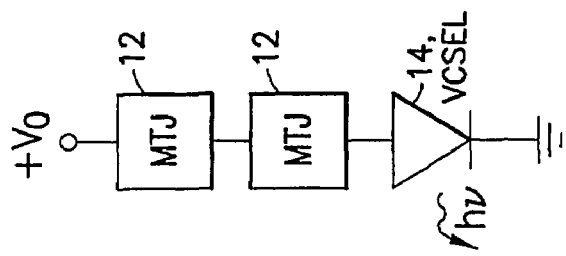
FIGS. 9A and 9B are graphs showing the VCSEL output power (arbitrary units) versus wavelength for the same voltage (1.83 V) and for H<−100 Oe and H>100 Oe, respectively, for an embodiment where two MTJs are connected in series, as shown in FIG. 9C.
Figure 9B:
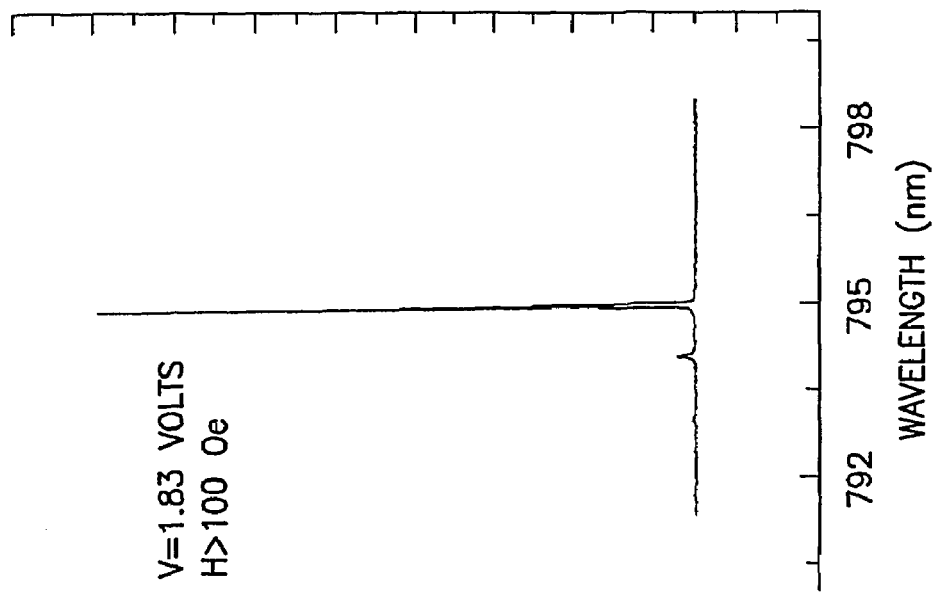
Figure 9A:
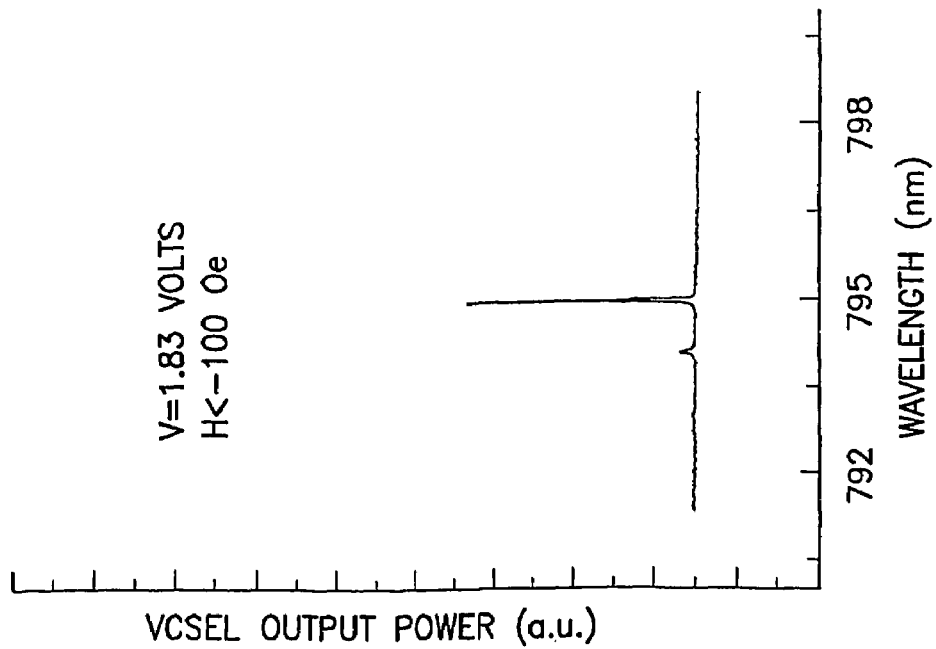

FIGS. 9A and 9B are graphs showing the output power (arbitrary units) of the VCSEL 14 versus wavelength for the same voltage (1.83 V) and for H<−100 Oe and H>100 Oe, respectively, for an embodiment where two MTJs 10 are connected in series with the VCSEL 14, as shown in FIG. 9C.

Figure 5A:
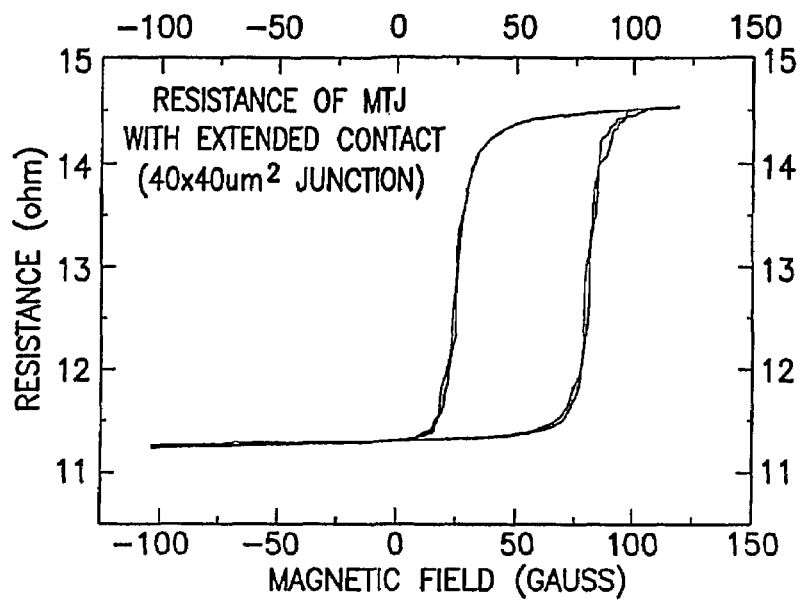
FIGS. 5A and 5B are graphs of the hybrid MOD, where
Figure 5B:
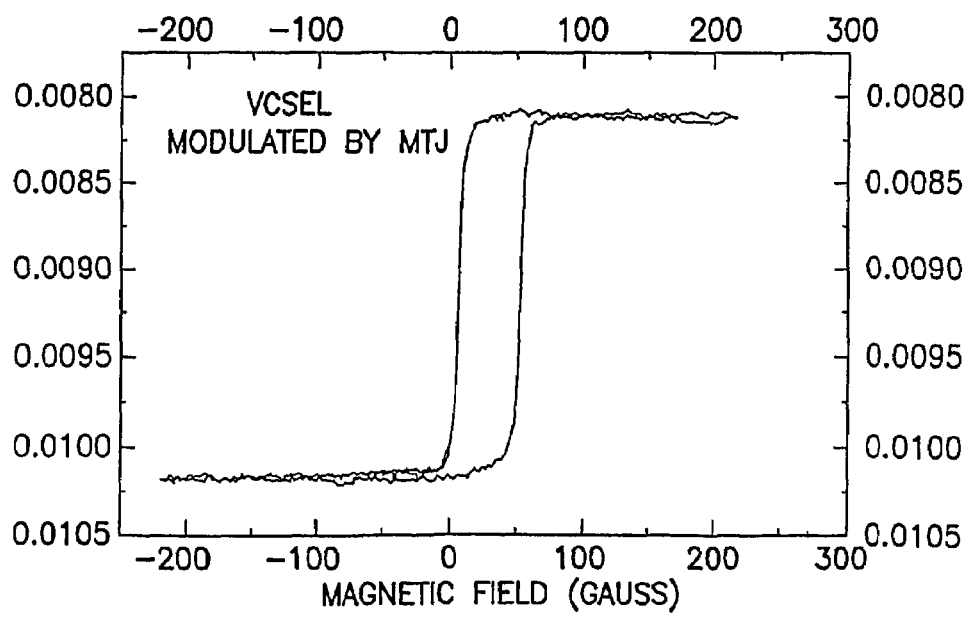

Referring now to FIGS. 5A and 5B, experimental verification of the foregoing is presented for an embodiment similar to that shown for FIG. 3. A low threshold current density VCSEL 14 was used in series with a NiFe/AlOx/NiCoFe MTJ 12, both mounted on a same substrate support. FIG. 5A compares the magnetoresistive response of the MTJ 12 alone, measured by standard conductance measurements in an external magnetic field, with that obtained by measuring the VCSEL laser output power (FIG. 5B) of the MOD 10 also in a magnetic field. To dramatize the effect, the magnetic field was directed in the easy axis direction of the MTJ 12 (switching mode). The similarity of the two hysteresis curves shown in FIGS. 5A and 5B illustrates how the hybrid magneto-optoelectronic device 10 faithfully translates the magnetic field response of the MTJ 12 to optical power variations in the output of the VCSEL 14. In the hard axis configuration (not shown), where the magnetoresistive effect is simply linear in the applied field, it was found that the magnetic field sensor 10 functions as a sensitive magnetic field sensor.

Figure 10:
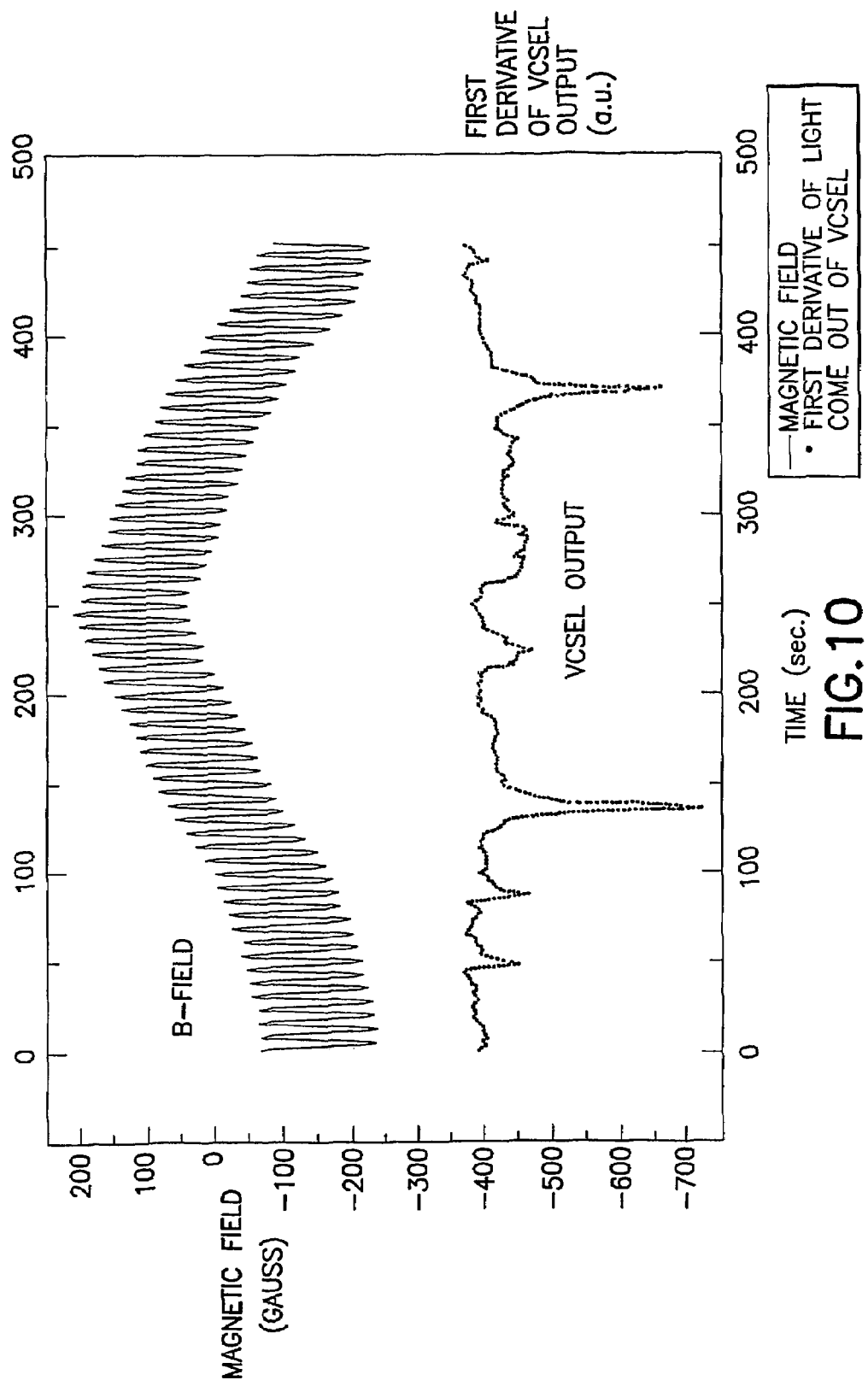
FIG. 10 shows VCSEL-based magnetic field detection operated in a differential mode, and plots a sinusoidally varying magnetic field and the resulting first derivative of the light output from the VCSEL.

FIG. 10 shows VCSEL-based magnetic field detection operated in a differential mode, and plots a sinusoidally varying magnetic field and the resulting first derivative of the light output from the VCSEL 14.

This invention can be employed to implement high-speed wireless communication between integrated circuit-scale electronic and optical circuits. This is true because the current pulses in digital and other types of integrated circuits create time-varying magnetic fields, and these time varying magnetic fields can be sensed by the hybrid MOD 10, or by an array of the MOD 10, and translated to a stream of optical pulses for remote detection and readout.

Thus, it can be appreciated that an aspect of this invention provides a method for transmitting information, and includes (a) expressing information as a time varying magnetic field; (b) generating light that has an intensity that varies as a function of a strength of the time varying magnetic field; (c) transmitting the light; (d) receiving the transmitted light; (e) detecting the intensity of the received light and (f) obtaining the information from the detected intensity.

Figure 6:
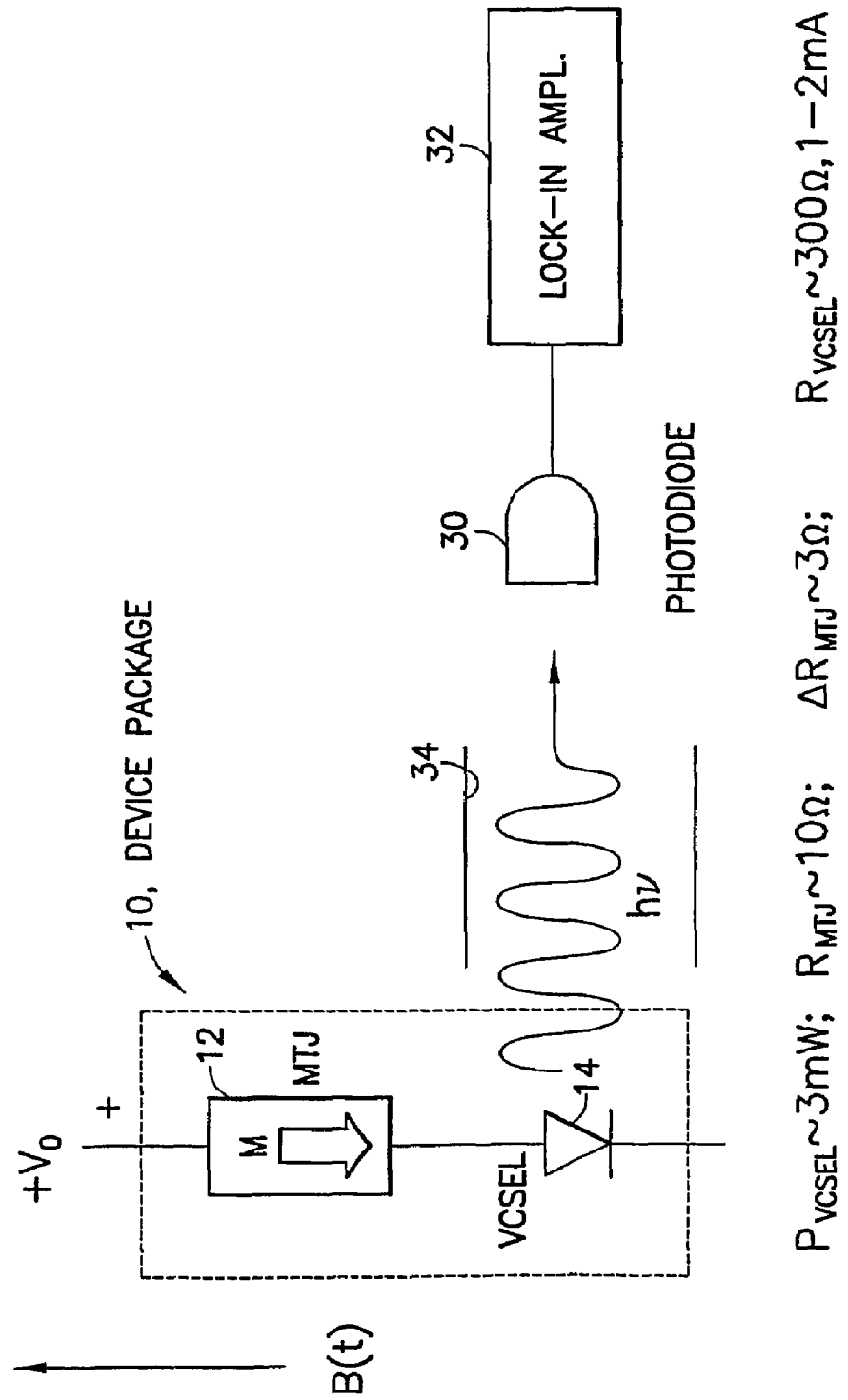
FIG. 6 is a circuit diagram of the combined VCSEL and MTJ MOD of FIGS. 1, 3 or 4, in combination with a remote photodetector and a lock-in amplifier for receiving the modulated optical signal from the MOD.

Further in this regard, FIG. 6 is a circuit diagram of the combined VCSEL and MTJ MOD 10 of FIGS. 1, 3 or 4, in combination with a remote photodetector, such as a photodiode 30 and an amplifier, such as a lock-in amplifier 32. The photodiode 30 receives the modulated optical signal from the MOD 10, converts it to an electrical signal, and the electrical signal is amplified by the lock-in amplifier 32. The amplified signal may then be processed to determine the intensity of the received light. The output optical wavelength of the VCSEL 14 is assumed to be transmitted through some transport medium 34 which can be, as examples, free space, an optical fiber, an optical waveguide, and combinations thereof. Various optical components, such as lenses, beam splitters and polarizers can be disposed in the optical path between the VCSEL 14 and the photodiode 30, if desired. Also, at one or more points the optical signal may converted to an electrical signal, relayed through wiring, and subsequently converted back to an optical signal. In some embodiments the MOD 10 may be translated relative to a source of a magnetic field of interest, such as by scanning the MOD 10 and/or moving the source of the magnetic field.

Figure 12:
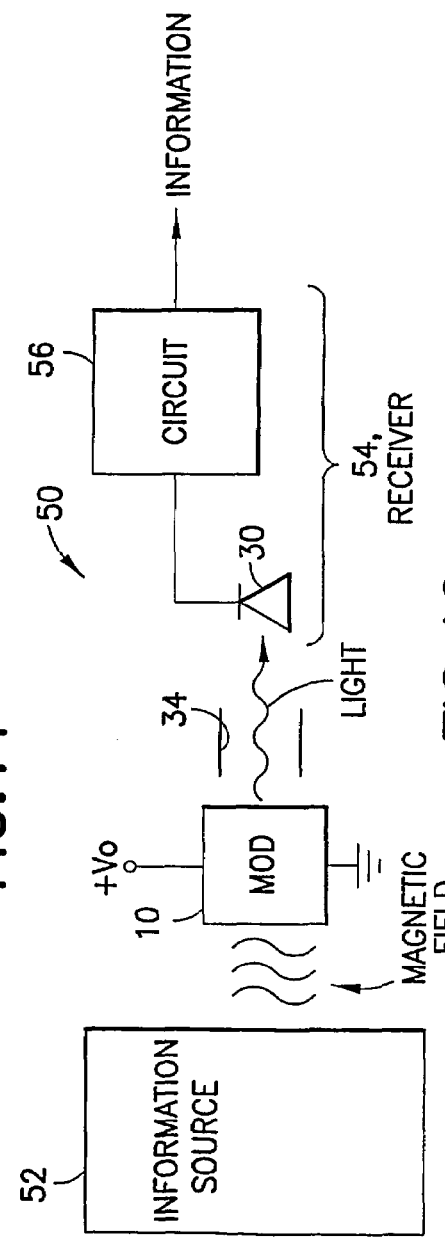
FIG. 12 is a simplified block diagram of a system for transmitting information, the system including an information source 52 expressing information as a time varying magnetic field and at least one of the MODs.

Still further in this regard, and referring to FIG. 12, a system 50 for transmitting information includes an information source 52 for expressing information as a time varying magnetic field; at least one of the MODs 10 that is magnetically coupled to the information source 52 for generating light that has an intensity that varies as a function of the strength of the time varying magnetic field; the transport medium 34, which may be any suitable means for conveying the light from the MOD 10; and a receiver 54 for receiving the conveyed light. The receiver includes the detector, such as the photodiode 30, for detecting the intensity of the received light and a circuit 56 such as, but not limited to, a data processor or a signal processor, for obtaining the information from the detected intensity. The light may be considered to be intensity modulated with the information, and the receiver circuit 56 maybe considered to function as a demodulator. As non-limiting examples, the information source 52 could include at least one of a magnetic data storage medium and an integrated circuit.

While described in the context of presently preferred non-limiting embodiments of this invention, those skilled in the art should recognize that various modifications can be made to these presently preferred embodiments, and that all such modifications will fall within the scope of this invention. For example, the light emitter of the MOD 10 need not be based on a semiconductor material, as certain types of known light emitting polymer materials could be used as well.

What is claimed is:

1. A light source for generating light that has an intensity that varies as a function of a strength of an ambient magnetic field, comprising a thin film multilayer magnetic sensing device having an electrical resistance that varies as a function of the strength of the ambient magnetic field, said magnetic sensing device being electrically coupled in series with a light emitter, said magnetic sensing device and said light emitter disposed over a common substrate.

2. A light source as in claim 1, where said magnetic sensing device comprises a magnetoresistive device.

3. A light source as in claim 1, where said magnetic sensing device comprises a giant magnetoresistive device.

4. A light source as in claim 1, where said magnetic sensing device comprises a magnetic tunnel junction.

5. A light source as in claim 1, where said light emitter is comprised of a light emitting diode.

6. A light source as in claim 1, where said light emitter is comprised of a laser diode.

7. A light source as in claim 1, where said light emitter is comprised of a vertical cavity surface emitting laser.

8. A light source as in claim 1, where said light emitter is comprised of a resonant cavity light emitting diode.

9. A light source as in claim 1, where said magnetic sensing device comprises a magnetic tunnel junction, where said light emitter is comprised of a vertical cavity surface emitting laser, and where said magnetic tunnel junction and said vertical cavity surface emitting laser are electrically coupled together in series between a power source terminal and a common terminal.

10. The light source of claim 9 wherein said magnetic sensing device and said light emitter define a footprint area over said common substrate of less than about 300 mm$^2$.

11. A light source as in claim 1, where said magnetic sensing device, said light emitter, and said substrate are disposed in stacked relation to one another.

12. The light source of claim 11 wherein said magnetic sensing device and said light emitter define a footprint area over said common substrate on the order of about $10^3$ μm$^2$.

13. A light source as in claim 11, where said magnetic sensing device comprises a magnetic tunnel junction, where said light emitter is comprised of a vertical cavity surface emitting laser, and where said magnetic tunnel junction and said vertical cavity surface emitting laser are electrically coupled together in series between a power source terminal and a common terminal.

14. A plurality of light sources as in claim 13 disposed over said substrate.

15. The plurality of light sources as in claim 14 wherein a first light source and a second light source are electrically coupled to a common voltage supply source.

16. The plurality of light sources of claim 14 wherein a first light source and a second light source are electrically coupled to different voltage supply sources.

17. A light source as in claim 1 wherein the magnetic sensing device exhibits an electrical resistance that is less than an electrical resistance of the light emitter for an ambient magnetic field intensity.

18. The light source of claim 1 wherein the light emitter exhibits a threshold current less than about 0.3 mA.

19. A magnetic field sensor comprising a thin film multilayer magnetic sensing device having an electrical resistance that varies as a function of a strength of an ambient magnetic field, said magnetic sensing device being electrically coupled with a light emitter for generating light that has an intensity that varies as a function of the strength of the ambient magnetic field, said magnetic sensing device and said light emitter disposed over a common substrate.

20. A magnetic field sensor as in claim 19 where said magnetic sensing device comprises a magnetoresistive device.

21. A magnetic field sensor as in claim 19 where said magnetic sensing device comprises a giant magnetoresistive device.

22. A magnetic field sensor as in claim 19 where said magnetic sensing device comprises a magnetic tunnel junction.

23. A magnetic field sensor as in claim 19, where said light emitter is comprised of a light emitting diode.

24. A magnetic field sensor as in claim 19, where said light emitter is comprised of a laser diode.

25. A magnetic field sensor as in claim 19, where said light emitter is comprised of a vertical cavity surface emitting laser.

26. A magnetic field sensor as in claim 19, where said light emitter is comprised of a resonant cavity light emitting diode.

27. A magnetic field sensor as in claim 19 where said magnetic sensing device comprises a magnetic tunnel junction, where said light emitter is comprised of a vertical cavity surface emitting laser, and where said magnetic tunnel junction and said vertical cavity surface emitting laser are electrically coupled together in series between a power source terminal and a common terminal.

28. A magnetic field sensor as in claim 19, where said magnetic sensing device, said light emitter, and said substrate are disposed in stacked relation to one another.

29. A magnetic field sensor as in claim 28, where said magnetic sensing device comprises a magnetic tunnel junction, where said light emitter is comprised of a vertical cavity surface emitting laser, and where said magnetic tunnel junction and said vertical cavity surface emitting laser are electrically coupled together in series between a power source terminal and a common terminal.

30. A plurality of magnetic field sensors each as in claim 29 disposed over said substrate.

31. The plurality of magnetic field sensors as in claim 30, wherein a first magnetic field sensor and a second magnetic field sensor are electrically coupled to a common voltage supply source.

32. The plurality of magnetic field sensors as in claim 30, wherein a first magnetic field sensor and a second magnetic field sensor are electrically coupled to different voltage supply sources.

* * * * *